United States Patent
Lee et al.

(10) Patent No.: US 9,681,540 B2
(45) Date of Patent: Jun. 13, 2017

(54) ELECTRODE MEMBER AND TOUCH WINDOW INCLUDING THE SAME

(71) Applicant: LG INNOTEK CO., LTD., Seoul (KR)

(72) Inventors: Soo Jin Lee, Seoul (KR); Jae Wan Park, Seoul (KR); Sang Yu Lee, Seoul (KR); Jae Hong Lee, Seoul (KR); Yeong Soo Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 267 days.

(21) Appl. No.: 13/890,922

(22) Filed: May 9, 2013

(65) Prior Publication Data

US 2013/0299222 A1   Nov. 14, 2013

(30) Foreign Application Priority Data

May 9, 2012   (KR) .................. 10-2012-0048995
Jul. 13, 2012  (KR) .................. 10-2012-0076632
Oct. 30, 2012  (KR) .................. 10-2012-0120967

(51) Int. Cl.
| | | |
|---|---|---|
| H05K 1/00 | (2006.01) | |
| G06F 3/041 | (2006.01) | |
| G06F 3/045 | (2006.01) | |
| H03K 17/975 | (2006.01) | |
| H05K 1/03 | (2006.01) | |
| G06F 3/044 | (2006.01) | |

(52) U.S. Cl.
CPC ............ *H05K 1/0306* (2013.01); *G06F 3/044* (2013.01); *G06F 2203/04112* (2013.01)

(58) Field of Classification Search
CPC ................. H05K 1/0306; G06F 3/044; G06F 2203/04112

USPC ................... 174/261; 345/173, 174; 200/600
See application file for complete search history.

(56) References Cited

U.S. PATENT DOCUMENTS

| | | | |
|---|---|---|---|
| 6,556,260 B1 * | 4/2003 | Itou et al. ................. | 349/69 |
| 8,749,518 B2 | 6/2014 | Kuo | |
| 2007/0186791 A1 * | 8/2007 | Kim .................... | B41F 9/01 |
| | | | 101/151 |
| 2008/0297453 A1 * | 12/2008 | Ray et al. ................ | 345/82 |
| 2009/0135151 A1 * | 5/2009 | Sun .................. | G06F 3/041 |
| | | | 345/173 |
| 2009/0160817 A1 * | 6/2009 | Wu et al. ............... | 345/173 |
| 2009/0219257 A1 | 9/2009 | Frey et al. | |
| 2010/0200286 A1 * | 8/2010 | Melcher et al. ........... | 174/261 |

(Continued)

FOREIGN PATENT DOCUMENTS

| | | |
|---|---|---|
| CN | 1395697 A | 2/2003 |
| CN | 101529327 A | 9/2009 |

(Continued)

OTHER PUBLICATIONS

European Search Report dated Sep. 26, 2014 in European Application No. 13167073.9.

(Continued)

*Primary Examiner* — Sherman Ng
(74) *Attorney, Agent, or Firm* — Saliwanchik, Lloyd & Eisenschenk

(57) ABSTRACT

Disclosed is an electrode member. The electrode member includes a substrate, and an electrode provided in the shape of a mesh on the substrate.

20 Claims, 9 Drawing Sheets

(56) References Cited

U.S. PATENT DOCUMENTS

| | | | |
|---|---|---|---|
| 2011/0007011 A1 | 1/2011 | Mozdzyn | |
| 2011/0018838 A1 | 1/2011 | Lee | |
| 2011/0019278 A1 | 1/2011 | Aoki | |
| 2011/0062146 A1 | 3/2011 | Kuriki | |
| 2011/0102361 A1* | 5/2011 | Philipp | 345/174 |
| 2012/0001863 A1* | 1/2012 | Kim et al. | 345/174 |
| 2012/0031746 A1 | 2/2012 | Hwang et al. | |
| 2012/0200527 A1* | 8/2012 | Rumsby | 345/174 |
| 2012/0299865 A1* | 11/2012 | Yu | 345/174 |
| 2012/0312677 A1 | 12/2012 | Kuriki | |
| 2012/0327021 A1 | 12/2012 | Ryu et al. | |
| 2013/0050105 A1* | 2/2013 | Lee et al. | 345/173 |
| 2013/0063371 A1* | 3/2013 | Lee et al. | 345/173 |
| 2013/0068603 A1 | 3/2013 | Kwak | |
| 2013/0087374 A1 | 4/2013 | Nah | |
| 2013/0147742 A1* | 6/2013 | Lee | G06F 3/041 345/173 |
| 2013/0161070 A1* | 6/2013 | Lee et al. | 174/250 |
| 2013/0162561 A1* | 6/2013 | Kim | G06F 3/04883 345/173 |
| 2013/0194220 A1 | 8/2013 | Lee et al. | |

FOREIGN PATENT DOCUMENTS

| | | |
|---|---|---|
| CN | 101982031 A | 2/2011 |
| CN | 102016767 A | 4/2011 |
| CN | 102053751 A | 5/2011 |
| CN | 102308366 A | 1/2012 |
| JP | H01-255026 | 10/1989 |
| JP | 2006344163 A | 12/2006 |
| JP | 2008091116 A | 4/2008 |
| JP | 2009302035 A | 12/2009 |
| JP | 2011175628 A | 9/2011 |
| KR | 10-1075428 B1 | 10/2011 |
| KR | 10-2012-0018059 A | 2/2012 |
| TW | 201104540 A | 2/2011 |
| TW | 201211867 A | 3/2012 |
| TW | M425338 U | 3/2012 |
| WO | WO-2011/108869 A2 | 9/2011 |
| WO | WO-2011136542 A2 | 11/2011 |
| WO | 2011149199 A2 | 12/2011 |
| WO | WO-2011162542 A2 | 12/2011 |
| WO | WO-2012015284 A2 | 2/2012 |

OTHER PUBLICATIONS

Office Action dated Aug. 27, 2013 in Korean Application No. 10-2012-0048995, filed May 9, 2012.

Office Action dated Sep. 2, 2015 in Chinese Application No. 201310170404.0.

Office Action dated Nov. 17, 2015 in Japanese Application No. 2013-099050.

Office Action dated Jun. 14, 2016 in Japanese Application No. 2013-099050.

Office Action dated Feb. 27, 2014 in Korean Application No. 1020120048995.

Office Action dated Nov. 9, 2016 in Chinese Application No. 201310170404.0.

Office Action dated Apr. 13, 2017 in Taiwanese Application No. 102116565.

* cited by examiner

ELECTRODE MEMBER AND TOUCH WINDOW INCLUDING THE SAME

CROSS-REFERENCE TO RELATED APPLICATIONS

This application claims the benefit under 35 U.S.C. §119 of Korean Patent Application Nos. 10-2012-0048995, filed May 9, 2012; 10-2012-0076632, filed Jul. 13, 2012; and 10-2012-0120967, filed Oct. 30, 2012, which are hereby incorporated by reference in their entirety.

BACKGROUND

The disclosure relates to an electrode member and a touch window including the same.

Recently, a touch window, which performs an input function through the touch of an image displayed on a display device by an input device such as a stylus pen or a finger, has been applied to various electronic appliances.

The touch window may be representatively classified into a resistive type touch window and a capacitive type touch window. In the resistive type touch window, the position of the touch point is detected by detecting the variation of resistance according to the connection between electrodes when pressure is applied to an input device. In the capacitive type touch window, the position of the touch point is detected by detecting the variation in capacitance between electrodes when a finger of the user is touched on the capacitive type touch window.

In the resistive type touch window, the repeated use thereof may degrade the performance thereof, and cause scratches. Accordingly, the interest on the capacitive type touch window representing superior endurance and having a long lifespan is increased.

Indium tin oxide (ITO) most extensively used for a transparent electrode of the touch window is expensive, and physically easily affected due to the curving and the bending of a substrate, so that the electrode characteristic thereof is deteriorated. Accordingly, the ITO may not be suitable for a flexible device. In addition, when the ITO is applied to a large-size touch window, the problem related to high resistance may occur.

In order to solve the problem, the studies and researches on alternative electrodes have been actively performed. In particular, although the substitute for ITO is formed by making the shape of the mesh using metallic materials, a Moire phenomenon may occur due to the shape of the mesh. The Moire phenomenon occurs when striped patterns are overlapped with each other. As adjacent striped patterns are overlapped with each other, the thickness of the striped patterns is increased, so that the overlapped striped patterns more stand out as compared with other stripped patterns. In order to overcome the Moire phenomenon, a haze film is provided on the metallic material forming the shape of the mesh, so that the Moire is weakened. However, the transmittance of the touch window is degraded due to the haze film, so that the whole performance of a display is degraded. In addition, the thickness of the touch window may be increased.

Meanwhile, in the case of metal, visibility is increased due to the reflection of light, so that the pattern of the transparent electrode may be recognized.

BRIEF SUMMARY

The embodiment provides an electrode member having improved reliability.

According to the embodiment, there is provided an electrode member. The electrode member includes a substrate, and an electrode provided in the shape of a mesh on the substrate.

As described above, the electrode member includes the electrode having the shape of a curved mesh. Accordingly, the pattern of the electrode is not viewed on the display including the electrode member according to the embodiment. In other words, even if the electrode includes metal, the pattern cannot be viewed. In addition, the electrode can be applied to a large-size display.

The electrode can include one selected from the group consisting of copper (Cu), aluminum (Al), nickel (Ni), tin (Sn), zinc (Zn), gold (Au), silver (Ag), and the alloy thereof. The materials can be substituted for existing indium tin oxide (ITO). The materials have an advantage in terms of a price, and can be formed through a simple process. In addition, since the materials can represent superior conductivity, the materials can improve the electrode characteristic.

According to the embodiment, since the electrode is provided in the shape of the curved mesh, thereby inhibiting the Moire phenomenon. In addition, according to the embodiment, the Moire phenomenon can be overcome without an additional haze film. In other words, the Moire phenomenon can be inhibited without the thickness increase and the loss of transmittance. Accordingly, the whole performance and the reliability of a display can be improved.

The transparent electrode of the touch window according to the embodiment includes the transparent electrode part and the anti-reflection part surrounding the transparent electrode part. The transparent electrode part may include metallic material. The metallic material can be substituted for existing ITO, has an advantage in terms of a price, and can be formed through a simple process. As the transparent electrode part has the shape of the mesh, the pattern of the transparent electrode part cannot be viewed in the active area. In other words, although the transparent electrode part includes metal, the pattern cannot be viewed. In addition, when the transparent electrode part may be formed through the printing process, the printing quality can be improved, and the high-quality touch window can be ensured.

The anti-reflection part is formed by oxidizing a portion of the transparent electrode part, so that light reflection can be inhibited by the anti-reflection part. In other words, the anti-reflection part is provided so that the visibility can be inhibited from being increased due to the light reflection of the transparent electrode part including a metallic material. In particular, since the anti-reflection part can be formed not only on the top surface of the transparent electrode part, but also on the lateral side of the transparent electrode part. Accordingly, the optical characteristic of the transparent electrode can be improved.

According to the method of fabricating the touch window of the embodiment, the touch window having the above effect can be manufactured.

According to the touch window of the embodiment, the electrode substrate of the touch window includes the sensor electrode layers formed at both surfaces of one substrate, so that the structure and the manufacturing process of the touch window can be minimized. Accordingly, the source material can be reduced, and the touch window can be constructed at low cost.

In addition, according to the embodiment, since the electrode substrate of the touch window has a simple structure, superior endurance and a superior optical characteristic can be provided.

Further, according to the embodiment, metal representing low resistance is used, so that the touch can be realized in a large area. In addition, since the embodiment is applicable to the capacitive type touch window, the embodiment can represent the sensitivity and the performance superior to those of an optical sensor touch scheme.

DETAILED DESCRIPTION

Figure 1:
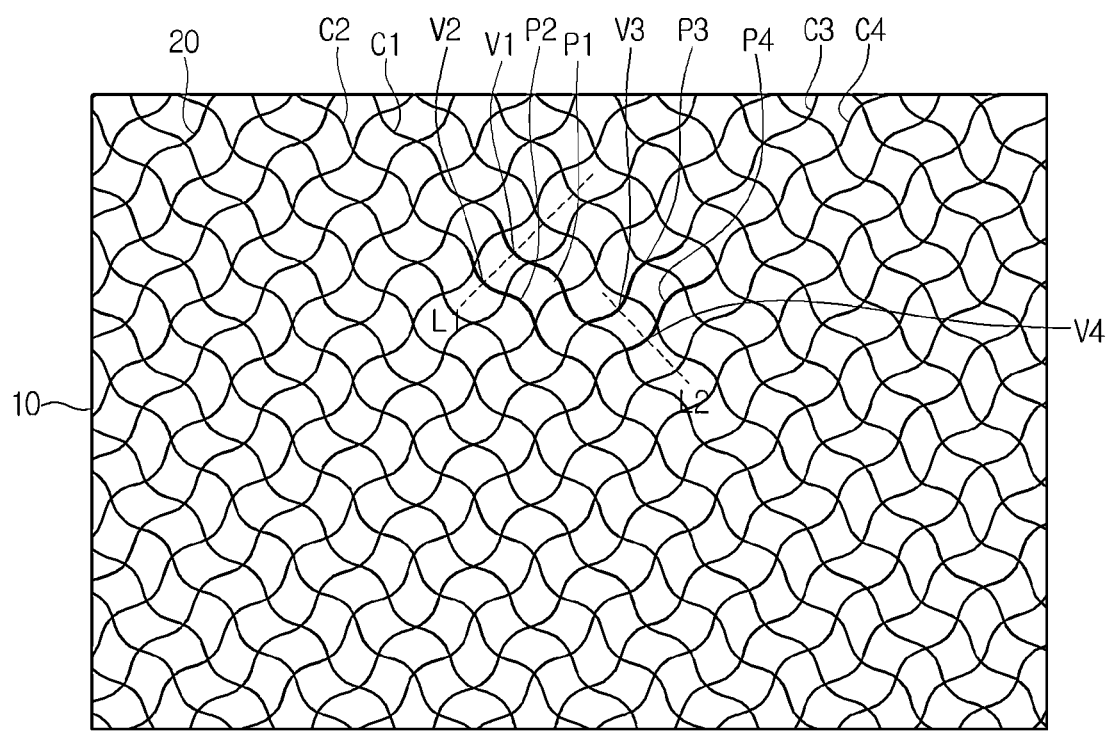
FIG. 1 is a plan view showing an electrode member according to one embodiment.
Figure 1:
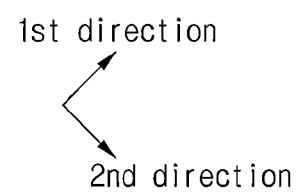

In the following description of the embodiments, it will be understood that, when a layer (film), a region, a pattern or a structure is referred to as being "on" or "under" a substrate, another layer (film), region, pad or patterns, it can be "directly" or "indirectly" on the other layer (film), region, pattern or structure, or one or more intervening layers may also be present. Such a position of each layer described with reference to the drawings.

The thickness and size of each layer (film), region, pattern or structure shown in the drawings may be exaggerated, omitted or schematically drawn for the purpose of convenience or clarity. In addition, the size of each layer (film), region, pattern or structure does not utterly reflect an actual size.

Hereinafter, the embodiment will be described in detail with reference to accompanying drawings.

An electrode member according to one embodiment will be described in detail with reference to FIGS. 1 to 4. FIGS. 1 to 4 are plan views showing an electrode member according to one embodiment.

Referring to FIG. 1, the electrode member according to one embodiment may include a substrate 10 and an electrode 20.

The substrate 10 may include a polyethylene terephthalate (PET) film or glass, but the embodiment is not limited thereto. The substrate 10 may include various materials so that the electrode 20 may be formed.

The electrode 20 may be formed on the substrate 10.

The electrode 20 is provided in the shape of a mesh.

The mesh includes a curve. The mesh may include various curves. In detail, referring to FIG. 1, the mesh may include a first curve C1, a second curve C2, a fourth curve C4, and a fourth curve C4.

The first curve C1 extends in the first direction.

The first curve C1 may be a sine waveform. In other words, the first curve C1 may include a first valley V1 and a first peak P1. The first valley V1 is the lowest part in the first curve C1. In other words, the first valley V1 is a wave trough. The first peak P1 is opposite to the first valley V1. The first peak P1 is the highest part in the first curve C1. In other words, the first peak P1 is a wave crest.

The second curve C2 extends in the first direction. The second curve C2 may be provided above or under the first curve C1. In other words, a plurality of the first and second curves C1 and C2 may be arranged in the second direction crossing the first direction.

The second curve C2 may be a sine waveform. In other words, the second curve C2 may include a second valley V2 and a second peak P2. The second valley V2 is the lowest part in the second curve C2. In other words, the second valley V2 is a wave trough. The second peak P2 is opposite to the second valley V2. The second peak P2 is the highest part in the second curve C2. In other words, the second peak P2 is a wave crest.

Referring to FIG. 1, the first and second valleys V1 and V2 may be provided on the same line L1. In detail, the first and second valleys V1 and V2 may be provided on one line L1 parallel to the second direction. In other words, the first and second curves C1 and C2 may be a structure in which curves having the same shape are repeatedly arranged.

Meanwhile, similarly, the third curve C3 extends in the second direction.

The third curve C3 may be a sine waveform. In other words, the third curve C3 may include a third valley V3 and a third peak P3. The third valley V3 is the lowest part in the third curve C3. In other words, the third valley V3 is a wave trough. The third peak P3 is opposite to the third valley V3. The third peak P3 is the highest part in the third curve C3. In other words, the third peak P3 is a wave crest.

The fourth curve C4 extends in the second direction. The fourth curve C4 may be provided above or under the third curve C3. In other words, a plurality of the first and fourth curves C1 and C4 may be arranged in the first direction.

The fourth curve C4 may be a sine waveform. In other words, the fourth curve C4 may include a fourth valley V4 and a fourth peak P4. The fourth valley V4 is the lowest part in the fourth curve C4. In other words, the fourth valley V4 is a wave trough. The fourth peak P4 is opposite to the fourth valley V4. The fourth peak P4 is the highest part in the fourth curve C4. In other words, the fourth peak P4 is a wave crest.

Referring to FIG. 1, the third and fourth valleys V3 and V4 may be provided on the same line L2. In detail, the third and fourth valleys V3 and V4 may be provided on one line L2 parallel to the first direction. In other words, the third and fourth curves C3 and C4 may be a structure in which curves having the same shape are repeatedly arranged.

According to the embodiment, although the description has been made in that the first to fourth C1 to C4 have sine waveforms, the embodiment is not limited thereto. The curves may have various waveforms having the amplitude and the period.

The line width of a mesh line may be in the range of 0.01 μm to 10 μm. The mesh line having the line width of 0.01 μm or less may not be formed due to the characteristic of the manufacturing process. If the line width is 10 μm or less, the pattern of the electrode 20 may not be viewed. Preferably, the line width of the mesh line may be about 5 μm.

Since the electrode 20 has the mesh shape, the pattern of the electrode 20 may not be viewed on the display including an electrode member according to the embodiment. In other words, although the electrode 20 is made of metal, the pattern of the electrode 20 may not be viewed. In addition, the electrode 20 may be applied to a large-size display.

The electrode 20 may include one selected from the group consisting of copper (Cu), aluminum (Al), nickel (Ni), tin (Sn), zinc (Zn), gold (Au), silver (Ag), and the alloy thereof. The materials may be substituted for existing indium tin oxide (ITO). The materials may have an advantage in terms of price, and may be applied through a simple process. In addition, since the materials represent superior conductivity, the materials can improve the characteristic of the electrode 20.

As described above, the electrode 20 has the shape of a curved mesh, thereby inhibiting a Moire phenomenon occurs due to the design of the mesh. The Moire phenomenon occurs because striped patterns are periodically overlapped with each other. According to the Moire phenomenon, as adjacent striped patterns are overlapped with each other, the thickness of the stripped pattern is increased, so that the overlapped striped patterns more stand out as compared with other stripped patterns.

In detail, in the case of a touch window structure that electrodes 20 are formed on two sheets of films, respectively, the Moire phenomenon occurs between the electrodes 20 formed on the films, respectively. In addition, a typical touch screen panel is bonded onto an LCD or an OLED serving as a liquid crystal panel. The Moire phenomenon occurs between the electrode 20 of the touch screen panel and a black matrix of the liquid crystal panel. In this case, according to the embodiment, the electrodes 20 are provided in the shape of a curved mesh, so that the Moire phenomenon can be inhibited. In addition, according to the embodiment, the Moire phenomenon can be overcome without an additional haze film. In other words, the Moire phenomenon can be inhibited without the thickness increase and the loss of transmittance. Accordingly, the whole performance and the reliability of a display can be improved.

Figure 2:
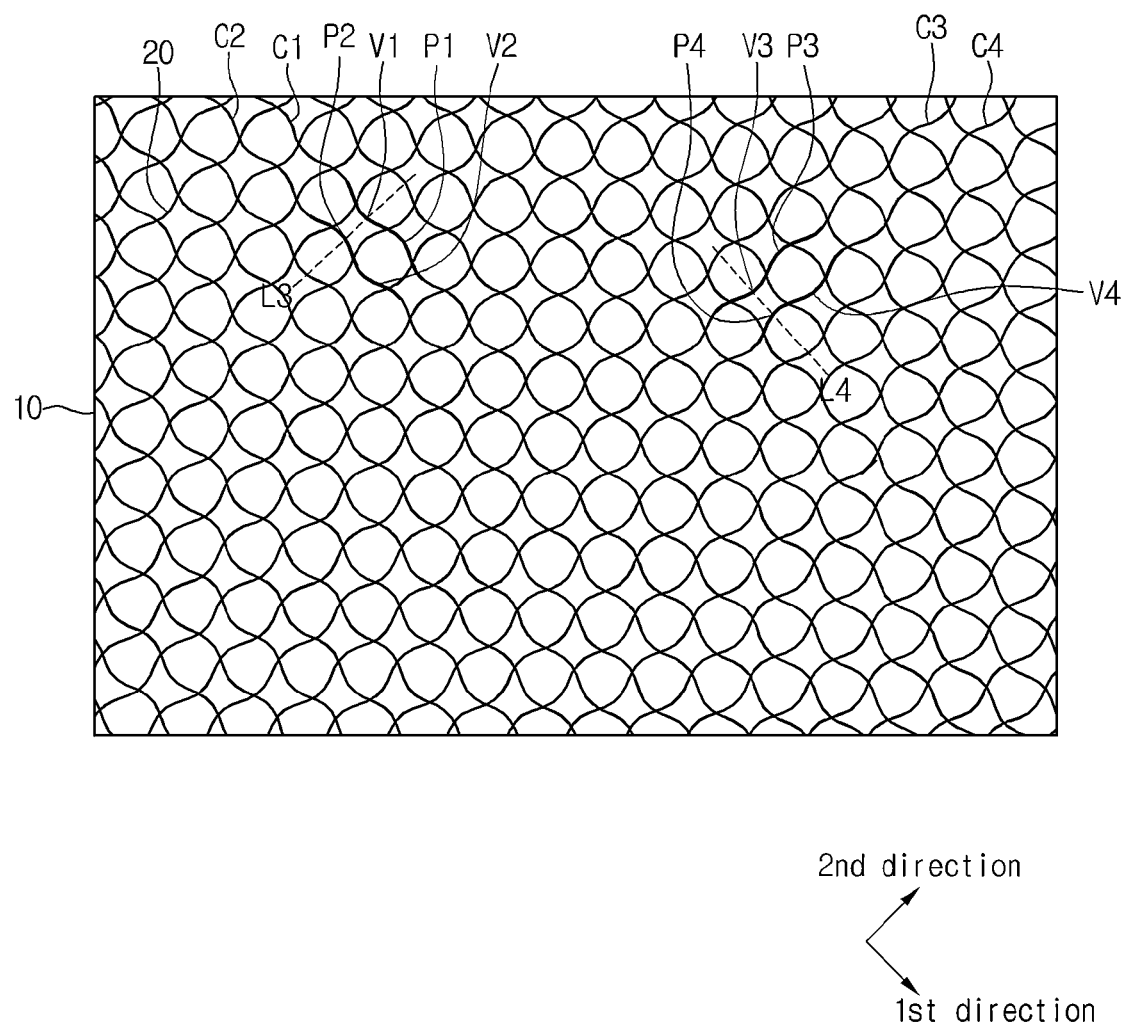
FIG. 2 is a plan view showing the electrode member according to one embodiment.

Meanwhile, the electrode member according to one embodiment will be described with reference to FIG. 2. Referring to FIG. 2, the electrode 20 is provided in the shape of a mesh including the first to fourth curves C1 to C4. In this case, the first valley V1 of the first curve C1 and the second peak P2 of the second curve C2 are provided on the same line L3. In other words, the first valley V1 and the second peak P2 may be provided on one line L3 parallel to the second direction. In other words, the first and second curves C1 and C2 may have the structure in which curves having shapes opposite to each other are repeatedly arranged.

Similarly, the third valley V3 of the third curve C3 and the fourth peak P4 of the fourth curve C4 are provided on the same line L4. In other words, the third valley V3 and the fourth peak P4 may be provided on one line L4 parallel to the first direction. In other words, the third and third curves C3 and C4 may have the structure in which curves having shapes opposite to each other are repeatedly arranged.

Figure 3:
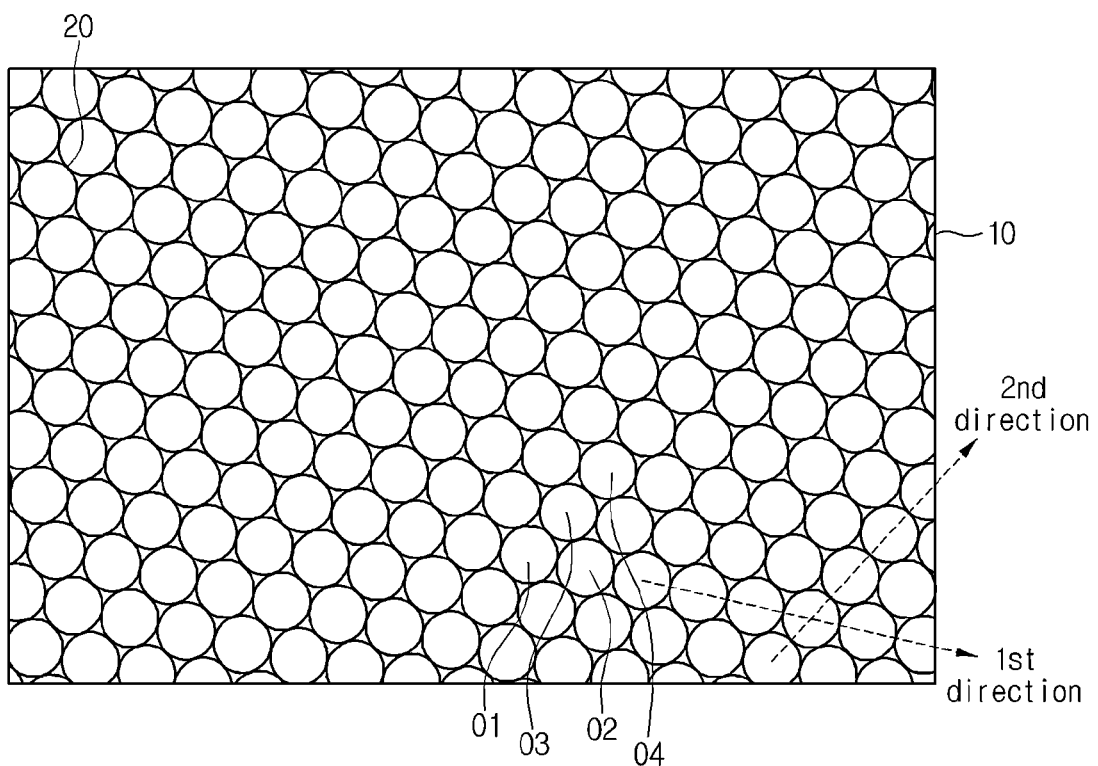
FIG. 3 is a plan view showing the electrode member according to one embodiment.

Meanwhile, hereinafter, the electrode member according to one embodiment will be described with reference to FIG. 3. Referring to FIG. 3, the electrode 20 is provided in the shape of a circular mesh. In other words, the mesh includes circles. In detail, the mesh may include a first circle O1, a second circle O2, a third circle O3, and a fourth circle O4.

The first and second circles O1 and O2 are provided in the first direction. In other words, the first and second circles O1 and O2 may be provided in parallel in the first direction.

The third and fourth circles O3 and O4 are provided in the second direction. In other words, the third and fourth circles O3 and O4 may be provided in parallel in the second direction.

In this case, the third circle O3 may be disposed between the first and second circles O1 and O2. In other words, the third circle O3 may cross the first and second circles O1 and O2.

Figure 4:
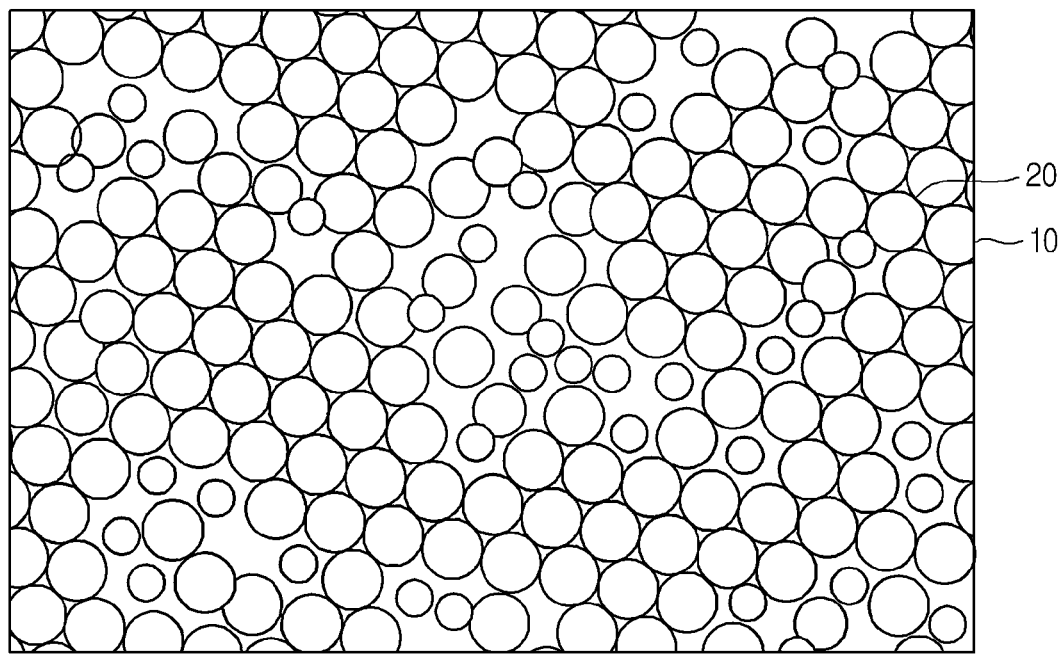
FIG. 4 is a plan view showing the electrode member according to one embodiment.

Meanwhile, referring to FIG. 4, the electrode member according to one embodiment includes the electrode 20 provided in the shape of a mesh on the substrate 10. The mesh has a circular shape. In the mesh, variously-sized circles may be randomly provided.

Figure 5:
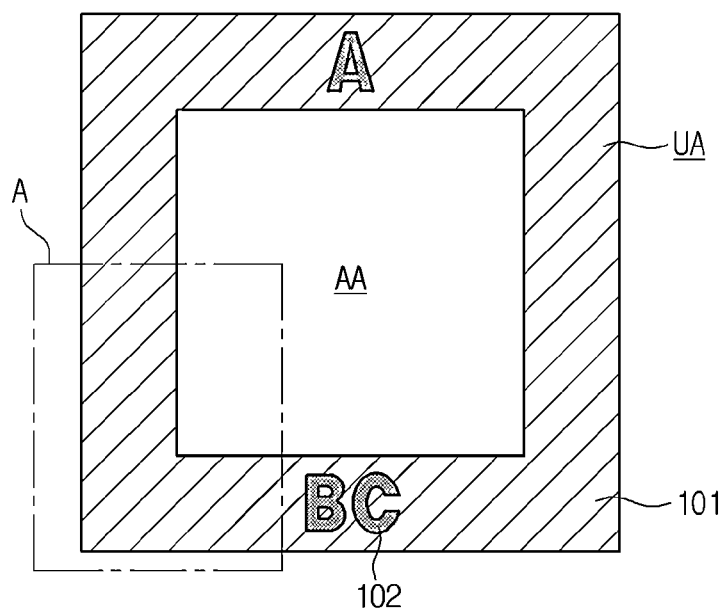
FIG. 5 is a plan view schematically showing a touch window according to one embodiment.
Figure 6:
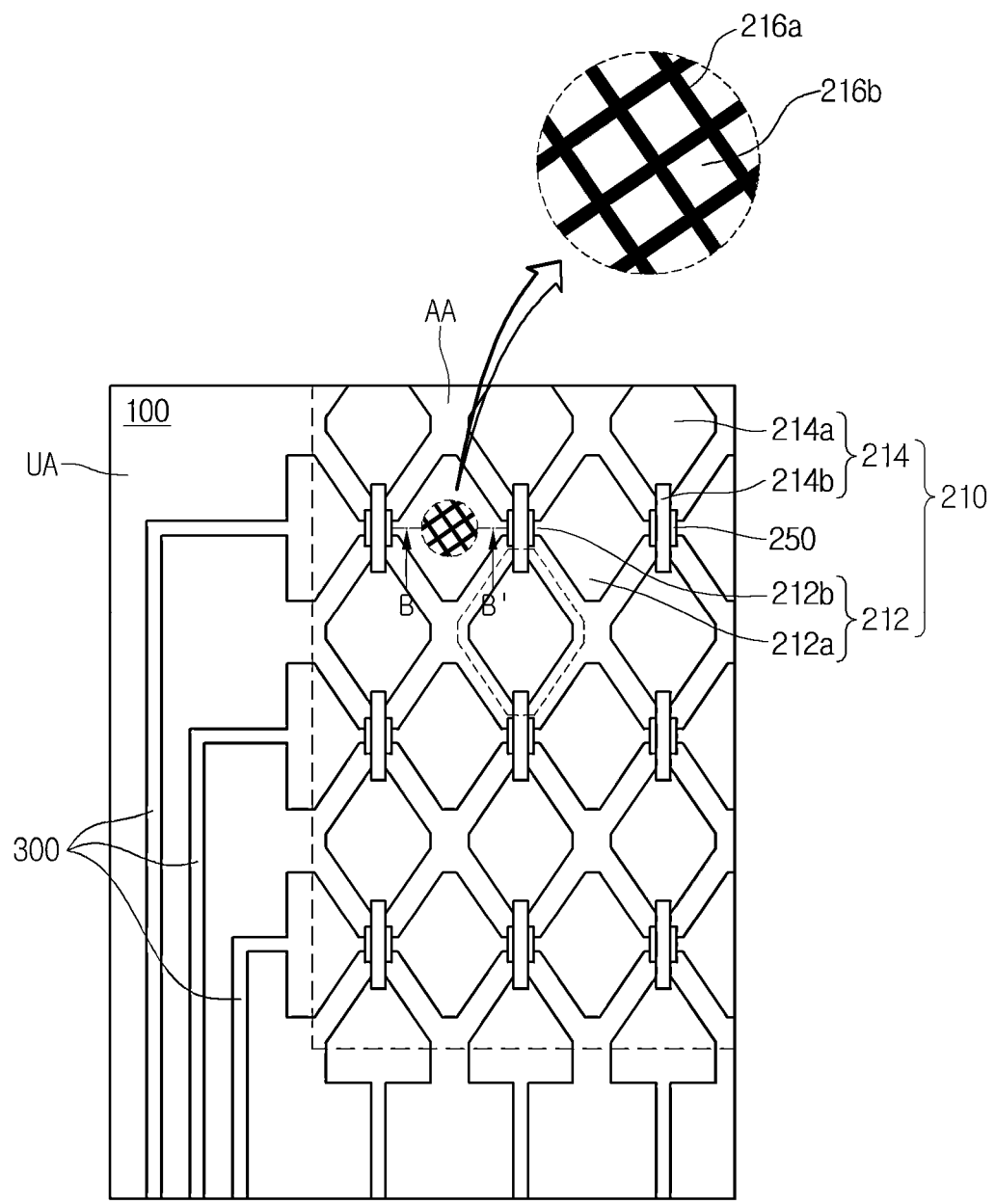
FIG. 6 is an enlarged view showing a part A of FIG. 5.
Figure 7:
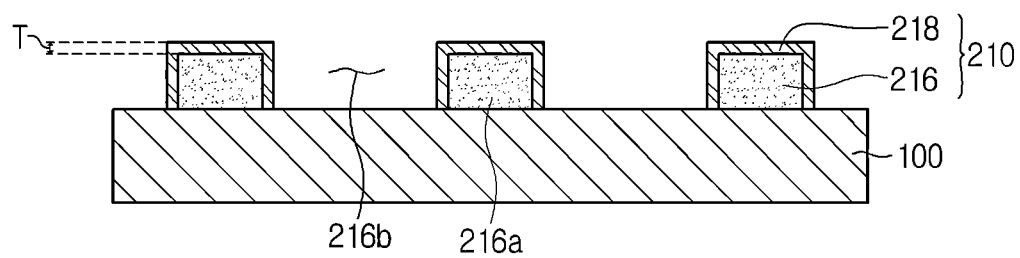
FIG. 7 is a sectional view taken along line B-B' of FIG. 6.

Hereinafter, a touch window according to the embodiment will be described with reference to FIGS. 5 to 7. FIG. 5 is a plan view showing schematically the touch window according to the embodiment. FIG. 6 is an enlarged view showing a part A of FIG. 5. FIG. 7 is a sectional view taken along line B-B' of FIG. 6.

Referring to FIGS. 5 and 7, the touch window according to the present embodiment includes a substrate 100 in which an active area AA to detect the position of an input device (e.g., finger) and an inactive area UA provided at a peripheral portion of the active area AA are defined. In this case, the active area AA may be provided therein with a transparent electrode 210 that may sense.

In this case, the active area AA may be provided therein with a transparent electrode 210 that may sense the input device. In addition, the inactive area UA may be provided therein with wires 300 electrically connecting transparent electrodes 210 to each other. Further, the inactive area UA may be provided therein with an external circuit connected to the wires 300. The inactive area UA may be provided therein with an outer dummy layer 101, and the outer dummy layer 101 may have a logo 102.

If the input device such as the finger is touched on the touch window, the variation of capacitance occurs in the touched part by the input device, and the touched part subject to the variation of the capacitance may be detected as a touch point.

Hereinafter, the touch window will be described in more detail.

The substrate 100 may include various materials to support the transparent electrode 210, the wires 300, and a circuit board formed on the substrate 100. For instance, the substrate 100 may include a glass substrate or a plastic substrate.

An outer dummy layer 101 is formed in the inactive area UA of the substrate 100. The outer dummy layer 101 may be coated with a material having a predetermined color so that the wires 300 and a printed circuit board connecting the wires 300 to external circuits cannot be seen from the outside. The outer dummy layer 101 may have a color suitable for a desired outer appearance thereof. For example, the outer dummy layer 101 may include black pigments to represent a black color. In addition, a desired logo 102 may be formed in the outer dummy layer 101 through various methods. The outer dummy layer 101 may be formed through a deposition, print, or wet coating scheme.

The transparent electrode 210 may be formed on the substrate 100. The transparent electrode 210 may detect whether the input device such as the finger is touched.

Referring to FIG. 6, the transparent electrode 210 may include a first electrode 212 and a second electrode 214.

The first electrode 212 includes a plurality of first sensor parts 212a to detect whether the input device such as the finger is touched, and first connection electrode parts 212b to connect the first sensor parts 212a to each other. The first connection electrode parts 212b connect the first sensor parts 212a to each other in a first direction (X-axis direction in accompanying drawings), so that the first electrode 212 may extend in the first direction.

Similarly, the second electrode 214 includes a plurality of second sensor parts 214a to detect whether the input device such as the finger is touched, and second connection electrode parts 214b to connect the second sensor parts 214a to each other. The second connection electrode parts 214b connect the second sensor parts 214a to each other in a second direction (Y-axis direction in accompanying drawings), so that the second electrode 214 may extend in the second direction.

An insulating layer 250 may be located between the first and second connection electrode parts 212b and 214b in order to inhibit the electrical short therebetween. The insulating layer 250 may include a transparent insulating material to insulate the first electrode 212 from the second electrode 214.

Meanwhile, the transparent electrode 210 may include at least two layers. In this case, the layers may include the same material, which will be further described later.

In detail, referring to FIG. 7, the transparent electrode 210 includes a transparent electrode part 216 and an anti-reflection part 218.

The transparent electrode part 216 is provided on the substrate 100. The transparent electrode part 216 may directly make contact with the substrate 100.

The transparent electrode part 216 may include metal. In detail, the transparent electrode part 216 includes oxidisable metal. For example, the transparent electrode part 216 includes copper (Cu). The copper (Cu) may be substituted for existing ITO, may have an advantage in terms of a price, and may be formed through a simple process.

Referring to FIG. 6, the transparent electrode part 216 may have the shape of a mesh. In detail, the transparent electrode part 216 includes a mesh line 216a and a mesh opening 216b. In this case, the line width of the mesh line 216a may be in the range of 1 μm to 10 μm. The mesh line of 1 μm or less may not be formed due to the characteristic of the manufacturing process. If the line width may be 10 μm or less, the pattern of the transparent electrode part 216 may not be viewed. Preferably, the line width of the mesh line 216a may be about 5 μm.

Meanwhile, as shown in FIG. 6, the mesh opening 216b may have the shape of a rectangle, but the embodiment is not limited thereto. The mesh opening 216b may have various shapes such as a polygonal shape including a diamond shape, a pentagonal shape, or a hexagonal shape, or a circular shape.

As the transparent electrode part 216 has the shape of the mesh, the pattern of the transparent electrode part 216 may not be viewed in the active area AA. In other words, although the transparent electrode part 216 includes metal, the pattern may not be viewed. In addition, although the transparent electrode part 216 is applied to a large-size touch window, the resistance of the touch window can be reduced. In addition, when the transparent electrode part 216 may be formed through the printing process, the printing quality can be improved, and the high-quality touch window can be ensured.

Thereafter, the anti-reflection part 218 may be provided on the transparent electrode part 216. The transparent electrode part 216 may vertically make contact with the anti-reflection part 218.

In addition, the anti-reflection part 218 may surround the transparent electrode part 216. The anti-reflection part 218 may cover the lateral side and the top surface of the transparent electrode part 216. Accordingly, the anti-reflection part 218 may directly make contact with the transparent electrode part 216 and the substrate 100.

The anti-reflection part 218 may include oxide. In detail, the anti-reflection part 218 may include a metallic oxide. When the transparent electrode part 216 includes first metal, the anti-reflection part 218 may include an oxide including the first metal.

The anti-reflection part 218 is formed by oxidizing a portion of the transparent electrode part 216. In other words, the anti-reflection part 218 is formed by blackening the portion of the transparent electrode part 216, thereby inhibiting light from being reflected.

For example, when the transparent electrode part 216 includes copper (Cu), the anti-reflection part 218 may include copper oxide (CuO or $Cu_2O$). Meanwhile, although the copper oxide represents various colors such as red, brown, or black, the black is advantageous in order to absorb light and inhibit the reflection thereof. Accordingly, in order to obtain the composition of CuO representing black, an oxidation condition must be properly adjusted.

The transparent electrode part 216 may include a metallic material representing superior electric conductivity while forming black oxide through oxidation, like Ag, Ni, Cr, and Co in addition to C.

The anti-reflection part 218 may have the thickness T in the range of 10 nm to 100 nm. If the thickness T of the anti-reflection part 218 is thinner than 10 nm, the anti-reflection part 218 may not perform an anti-reflection function. In addition, if the thickness T of the anti-reflection part 218 is thicker than 100 nm, the thickness of the transparent electrode part 216 is relatively reduced, so that the electric conductivity of the transparent electrode 210 may be lowered.

The anti-reflection part 218 is provided so that the visibility can be inhibited from being increased due to the light reflection of the transparent electrode part 216. In particular, since the anti-reflection part 218 is formed not only on the top surface of the transparent electrode part 216, but also on the lateral side of the transparent electrode part 216, the anti-reflection part 218 is advantageous. Accordingly, the optical characteristic of the transparent electrode 210 can be improved.

According to the related art, after forming a transparent electrode part including a metallic material, an anti-reflection layer is additionally deposited on the transparent electrode part, so that the anti-reflection layer is patterned simultaneously with the transparent electrode part when the transparent electrode part is patterned. However, in this case, since the anti-reflection layer is not formed at the lateral side of the transparent electrode part, light reflection is still caused.

Thereafter, the wires 300 are formed in the inactive area UA. The wires 300 may apply an electric signal to the transparent electrode 210. The wires 300 are formed in the inactive area UA so that the wires 300 may not been viewed.

Meanwhile, although not shown, the circuit board connected to the wires may be further provided. The circuit board may include various printed circuit boards. For example, the circuit board may include a flexible printed circuit board (FPCB).

Hereinafter, a method of manufacturing a touch window according to the embodiment will be described with reference to FIGS. 8 and 9. For clarity, details of parts the same as or similar to the above description will be omitted.

Figure 8:
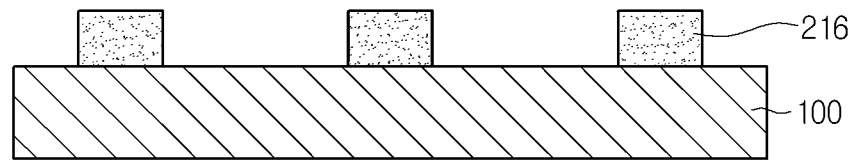
FIGS. 8 and 9 are sectional views showing a method of manufacturing a touch window according to one embodiment.
Figure 9:
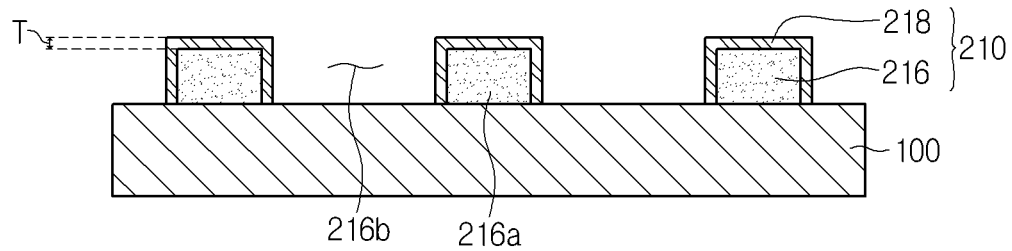

FIGS. 8 and 9 are sectional views showing the method of fabricating the touch window according to the embodiment.

Referring to FIG. 8, after preparing a substrate 100, a transparent electrode may be formed on the substrate 100. In detail, the transparent electrode part 216 may be formed on the substrate 100.

The transparent electrode part 216 may be formed through a printing process. The transparent electrode part 216 may be formed by directly coating printing ink on the substrate 100. For example, the transparent electrode part 216 may be formed through an offset printing process. In particular, when a reverse offset printing process is used, a fine pattern can be printed. In other words, the transparent electrode part 216 may be formed while the printing quality of the transparent electrode part 216 having the mesh shape is being ensured, but the embodiment is not limited thereto. In other words, the transparent electrode part 216 may be formed through a patterning process after a deposition process.

Thereafter, referring to FIG. 9, the anti-reflection part 218 may be formed by oxidizing a portion of the transparent electrode part 216. The anti-reflection part 218 may be formed through a dry oxidation process or a wet oxidation process. The dry oxidation process is to perform heat treatment at an oxygen atmosphere, and the wet oxidation process is to use a solution.

For example, the anti-reflection part 218 may be formed through a plasma oxidation process. According to the plasma oxidation process, if voltage is applied to an anode and a cathode in an electrolyte, plasma may be generated. In this case, the plasma reacts with metal, so that a film is formed on the surface of the metal. However, the embodiment is not limited thereto, but the anti-reflection part 218 may be formed through various oxidation schemes.

In this case, the thickness T of the anti-reflection part 218 can be adjusted by adjusting oxidation time.

Hereinafter, an electrode substrate of a touch window according to one embodiment will be described with reference to FIGS. 14 and 17.

Figure 10:
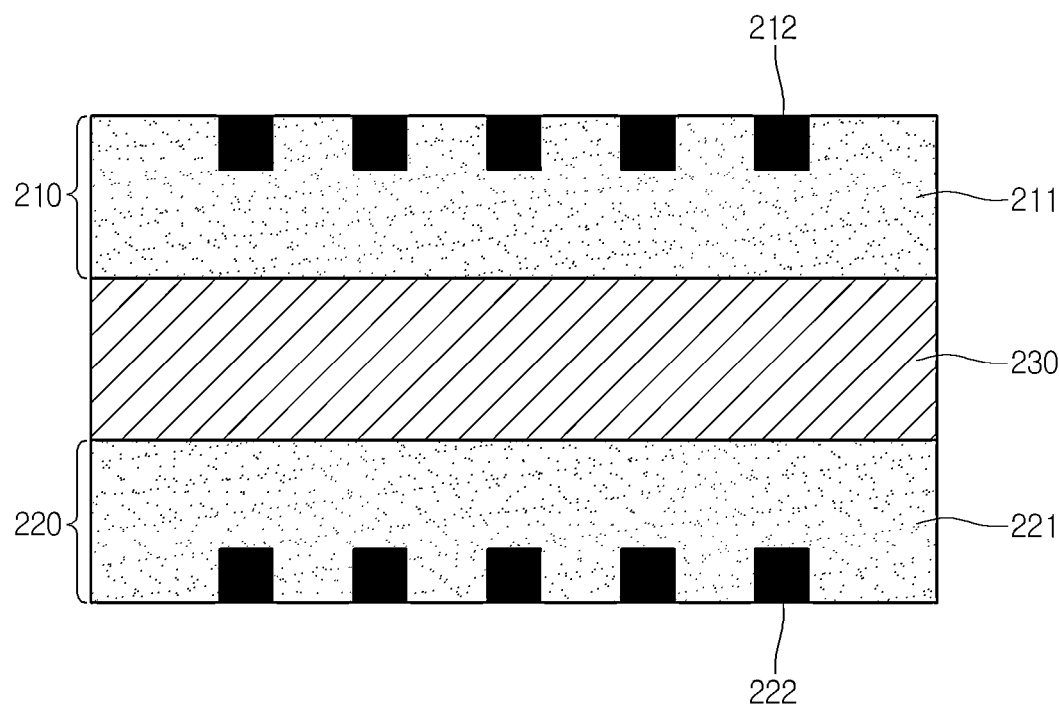
FIG. 10 is a sectional view showing the electrode member according to one embodiment.

FIG. 10 is a sectional view showing the electrode member of the touch window according to one embodiment.

The structure of the electrode substrate of the touch window according to one embodiment will be described with reference to FIG. 10.

As shown in FIG. 10, the electrode substrate of the touch window includes a substrate 230 and sensor electrode layers 210 and 220.

The substrate 230 includes one of polyethylene terephthalate resin (PET), polycarbonate (PC), polymethyl methacrylate (PMMA), triacetate cellulose (TAC), and polyether sulfone (PES). The sensor electrode layers 210 and 220 are formed on one surface of the substrate 230 and on an opposite surface of the substrate 230.

In more detail, as shown in FIG. 10, the first sensor electrode layer 210 is formed on the top surface of the substrate 230, and the second sensor electrode layer 220 is formed on the bottom surface of the substrate 230.

The first sensor electrode layer 210 includes a first resin layer 211 and a first electrode pattern part 212.

The first electrode pattern part 212 is formed in the first resin layer 211. The first resin layer 211 is formed in the surface thereof with an engraved fine pattern, and metal is filled in the engraved fine pattern, thereby forming the first electrode pattern part 212. In this case, the first resin layer 211 includes a photo-curable resin layer (UV resin). The metal filled in the engraved fine pattern may include one of silver (Ag), platinum (Pt), tungsten (W), silver-carbon (Ag—C), copper (Cu), aluminum (Al), nickel (Ni), chrome (Cr), and nickel-phosphor (Ni—P).

The above first electrode pattern part 212 does not protrude beyond the surface of the first resin layer 211.

A second electrode pattern part 222 is formed on the bottom surface of the substrate 230 having the first sensor electrode layer 210. In other words, the first and second sensor electrode layers 210 and 220 are formed on both surfaces of the substrate 230 while being symmetric to each other.

Similarly to the first sensor electrode layer 210, the second sensor electrode layer 220 includes a resin layer 221 and a second electrode pattern part 222.

The second electrode pattern part 222 is formed in the second resin layer 221. The second resin layer 221 is formed in the surface thereof with an engraved fine pattern, and metal is filled in the engraved fine pattern, thereby forming the second electrode pattern part 222. In this case, the second resin layer 221 includes a photo-curable resin layer (UV resin). The metal filled in the engraved fine pattern may include one of silver (Ag), platinum (Pt), and tungsten (W).

The above second electrode pattern part 222 does not protrude beyond the surface of the second resin layer 221.

Figure 11:
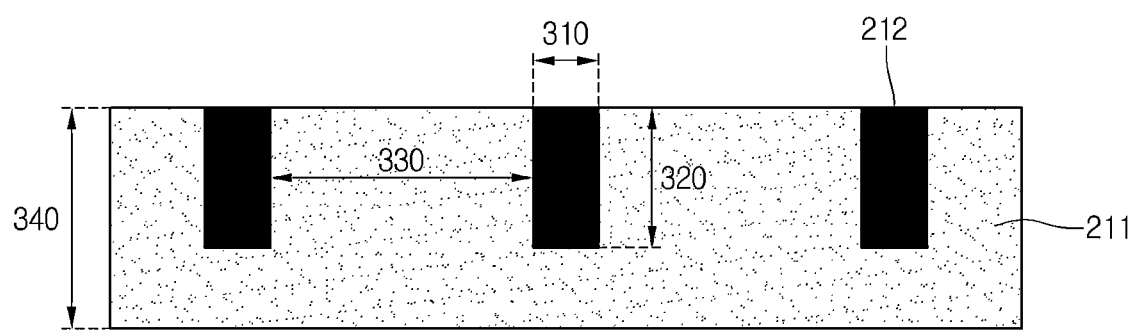
FIG. 11 is an enlarged view showing the electrode member according to one embodiment.

FIG. 11 is a sectional view showing the sensor electrode layer according to one embodiment. Hereinafter, the structure of the sensor electrode layer will be described in detail with reference to FIG. 11.

As shown in FIG. 11, the sensor electrode layer includes the resin layer 211 and the electrode pattern part 212 formed in the resin layer 211.

The resin layer 211 is formed in the surface thereof with the engraved fine pattern, and metal is filled in the engraved fine pattern, thereby forming the first electrode pattern part 212. In this case, preferably, a width 310 and a depth 320 of each first electrode pattern part 212 may be formed in the range of 1 μm to 10 μm. The distance between the first electrode pattern parts 212 is preferably in the range of 100 μm to 500 μm. In addition, preferably, the thickness 340 of the resin layer 211 may be in the range of 5 μm to 30 μm.

Figure 12:
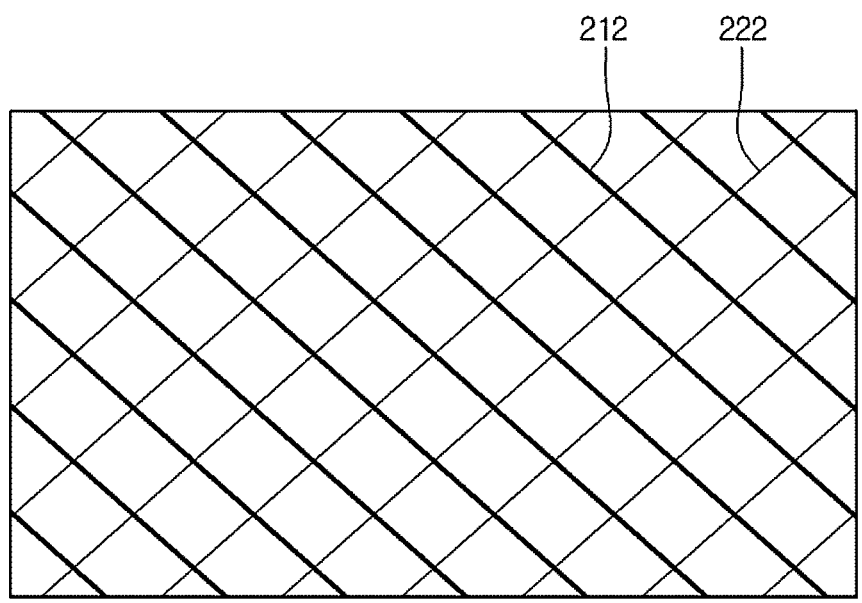
FIG. 12 is a plan view showing the electrode member according to one embodiment.

FIG. 12 is a top view showing the electrode substrate of the touch window according to one embodiment.

As shown in FIG. 12, the electrode pattern parts 212 and 222 are provided in the resin layers.

When the electrode substrate of the touch window according to one embodiment is viewed from the top, the electrode pattern parts 212 and 222 cross each other to construct the shape of a mesh.

Figure 13:
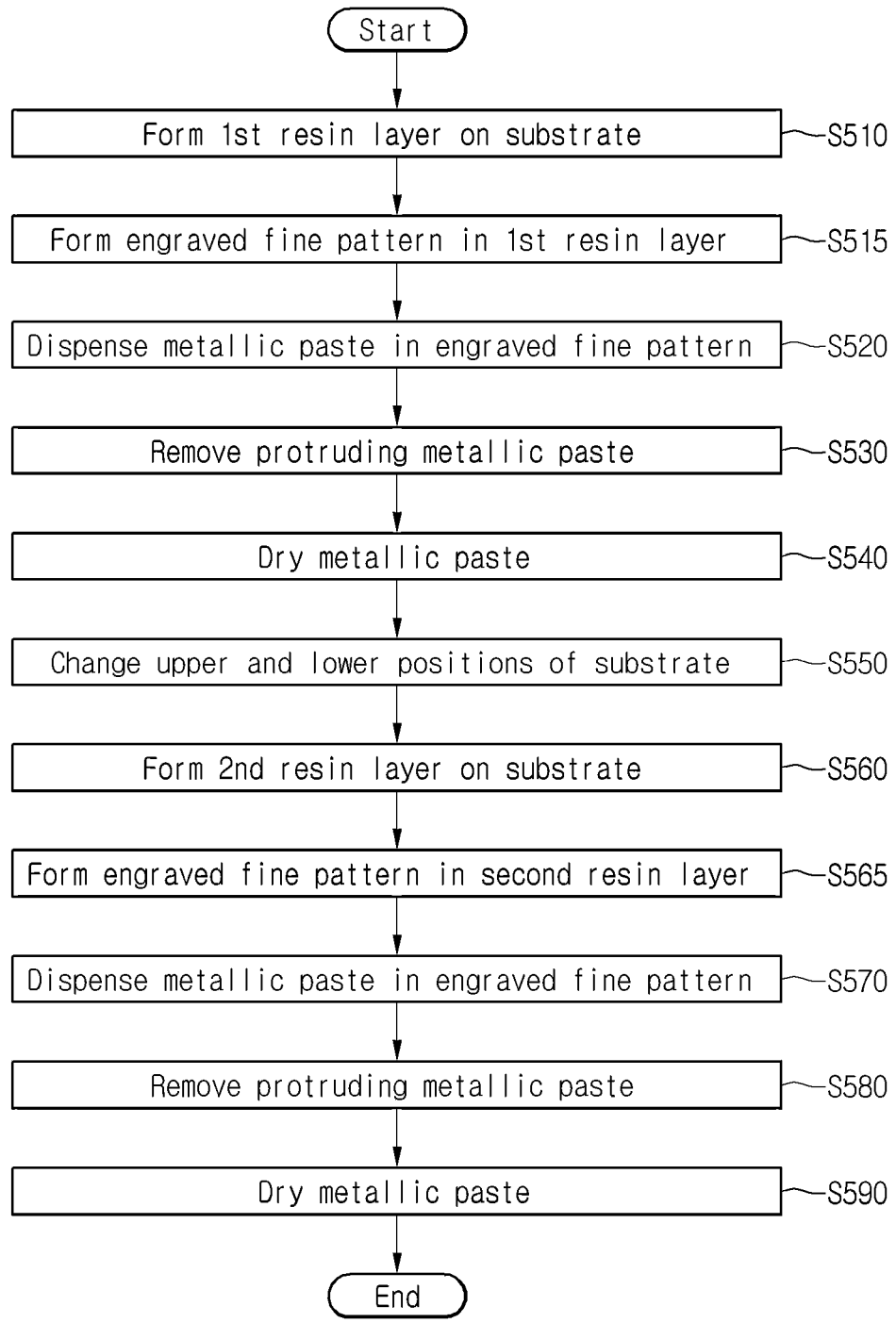
FIG. 13 is a flowchart showing the method of manufacturing the electrode member according to one embodiment.

FIG. 13 is a flowchart showing the method of manufacturing the electrode substrate of the touch window according to one embodiment.

According to one embodiment, when the electrode substrate of the touch window is manufactured, the first sensor electrode layer is first formed on the surface of the substrate, the top and bottom surfaces of the substrate are bottom-up arranged, and then the second electrode layer is formed on the substrate.

Hereinafter, the method of manufacturing the electrode substrate of the touch window will be described in more detail.

The first resin layer is formed on the substrate (step S510).

In this case, preferably, the first resin layer may be formed by using a mold, and the mold includes nickel (Ni).

An engraved fine pattern is formed in the surface of the first resin layer having the above structure (step S515), and metallic paste is dispensed in the engraved fine pattern (step S520). When the metallic paste is dispensed as described above, metal is coated with a thin thickness through a slot die, and a dispensing process is performed with respect to only the front surface provided in the dispensing direction.

The metallic paste protruding beyond the surface of the first resin layer is removed (step S530). In more detail, preferably, the metallic paste protruding beyond the surface of the first resin layer is scrapped out by using a tool such as a knife and the scrapped surface is cleanly treated, which is a doctoring process.

Accordingly, metal is filled in the engraved fine pattern of the first resin layer of the first sensor electrode layer, and metallic paste filled in the engraved fine pattern is dried, thereby forming the first electrode pattern part (step S540). In this case, when the metallic paste is dried, hot air or an IR heater is used.

Meanwhile, after the first electrode pattern part has been formed as described above, a process of wiping the surface of the first sensor electrode layer may be additionally performed in order to improve the surface state of the first sensor electrode layer. The wiping process may include a process using a non-woven fabric or a squeeze process using a blade, and may employ an additional solvent.

Thereafter, the substrate is bottom-up arranged, so that the upper and lower portions of the substrate are changed to each other (step S550), and the second resin layer is formed on the substrate (step S560). In this case, similarly to the first resin layer, the second resin layer may be formed by using a mold, and the mold preferably includes nickel (Ni).

The engraved fine pattern is formed in the surface of the second resin layer having the structure (step S565), and the metallic paste is dispensed in the engraved fine pattern (step S570). Similarly, preferably, when the metallic paste is dispensed, the metal is coated with a thin thickness through a slot die, and the dispensing process is performed with respect to only the front surface provided in the dispensing direction.

Thereafter, the metallic paste protruding beyond the surface of the third resin layer is removed (step S580). The metallic paste protruding beyond the surface of the second resin layer is scrapped out by using a tool such as a knife and the scrapped surface is cleanly treated, which is a doctoring process.

Accordingly, metal is filled in the engraved fine pattern of the second resin layer of the second sensor electrode layer, and the filled metallic paste is dried, thereby forming the second electrode pattern part (step S590). In this case, when the metallic paste is dried, hot air or an IR heater is preferably used.

Meanwhile, after the second electrode pattern part has been formed as described above, a process of wiping the surface of the second sensor electrode layer may be additionally performed in order to improve the surface state of the second sensor electrode layer. The wiping process may include a process using a non-woven fabric or a squeeze process using a blade, and may employ an additional solvent.

The features, structures, and effects described in the above embodiments are included in at least one embodiment of the present invention, and are not necessarily limited to only one embodiment. Moreover, the features, structures, and effects described in the embodiments may also be combined or modified to be carried out in other embodiments by those skilled in the art to which the embodiments pertain. Thus, the contents related to the combination and modification shall be construed to be included in the scope of the present invention.

Further, although the embodiments have been mainly described until now, they are just exemplary and do not limit the present invention. Thus, those skilled in the art to which the present invention pertains will know that various modifications and applications which have not been exemplified may be carried out within a range which does not deviate from the essential characteristics of the embodiments. For example, the constituent elements described in detail in the exemplary embodiments can be modified to be carried out. Further, the differences related to such modifications and applications shall be construed to be included in the scope of the present invention specified in the attached claims.

What is claimed is:

1. A touch window comprising: a substrate comprising an active area to detect a position of an input device and an inactive area provided at a peripheral portion of the active area; a transparent electrode part having a shape of a mesh and a pattern formed in the active area of the substrate; an anti-reflection part surrounding the transparent electrode part; and an outer dummy layer formed in the inactive area of the substrate, wherein the anti-reflection part covers a lateral side and a top surface of the transparent electrode part, wherein the anti-reflection part directly makes contact with the transparent electrode part and the substrate, wherein the anti-reflection part exposes the substrate through a mesh opening between the pattern and an adjacent pattern, and wherein the anti-reflection part has a thickness smaller than that of the transparent electrode part.

2. The touch window of claim 1, wherein the substrate comprises an UV resin layer.

3. The touch window of claim 1, wherein the transparent electrode part comprises a curve.

4. The touch window of claim 3, wherein the curve has a sine waveform.

5. The much window of claim 3, wherein the curve comprises first and second curves extending in a first direction, the first curve comprises a first valley and a first peak opposite to the first valley, and the second curve comprises a second valley and a second peak opposite to the second valley.

6. The touch window of claim 5, wherein the first valley is arranged in line with the second valley or the second peak.

7. The touch window of claim 5, wherein the second curve is arranged in parallel to the first curve.

8. The touch window of claim 5, wherein the second curve is adjacent to the first curve.

9. The touch window of claim 3, wherein the curve has a shape of a circle.

10. The touch window of claim 9, wherein the curve comprises first and second circles arranged in a first direction, and third and fourth circles arranged in a second direction crossing the first direction, and the third circle is disposed between the first and second circles.

11. The touch window of claim 1, wherein the transparent electrode part comprises a first metal, and wherein the anti-reflection part comprises an oxide including the first metal.

12. The touch window of claim 1, wherein the anti-reflection part has a black color, and
wherein the outer dummy layer has the black color.

13. The touch window of claim 1, wherein the anti-reflection part has a thickness in a range of 10 nm to 100 nm.

14. A touch window comprising:
a substrate including an active area to detect a position of an input device and an inactive area provided at a peripheral portion of the active area;
a first sensor electrode layer formed on a top surface of the substrate;
a second sensor electrode layer formed on a bottom surface of the substrate; and
an outer dummy layer formed in the inactive area of the substrate;
wherein the first sensor electrode layer includes a first resin layer and a first electrode pattern part;
wherein the second sensor electrode layer includes a second resin layer and a second electrode pattern part;
wherein the first and second sensor electrode layers are formed on both surfaces of the substrate while being symmetrical to each other;
wherein the first electrode pattern part and the second electrode pattern part are disposed at positions corresponding to each other;
wherein the first and second resin layers include a photo-curable resin;
wherein the first and second resin layers comprise engraved patterns;
wherein the first and second electrode pattern parts formed with a metal fill the engraved patterns;
wherein a depth of each first electrode pattern part and each second electrode pattern part is in a range of 1 μm to 10 μm;
wherein the first and second electrode pattern parts have a shape of a mesh;
wherein the first and second electrode pattern parts are formed in the active area of the substrate; and
wherein the first and second electrode pattern parts have a curved shape.

15. The touch window of claim 14, wherein the engraved patterns of the first and second resin layer have a depth greater than the first and second electrode pattern parts.

16. The touch window of claim 14, wherein the first electrode pattern part and the second electrode pattern part cross each other when viewed from above.

17. The touch window of claim 14, wherein the engraved patterns have a width in a range of from 1 μm to 10 μm.

18. The touch window of claim 14,
wherein the substrate includes one of polyethylene terephthalate (PET) resin, polycarbonate (PC), polymethyl methacrylate (PMMA), triacetate cellulose (TAC), and polyether sulfone (PES), and
wherein the metal includes one of platinum (Pt), tungsten (W), copper (Cu), aluminum (Al), nickel (Ni), chrome (Cr), and nickel-phosphor (Ni—P).

19. The touch window of claim 14, wherein a thickness of the first resin layer is in a range of 5 μm to 30 μm and a thickness of the second resin layer is in a range of 5 μm to 30 μm.

20. The touch window of claim 14, wherein a distance between adjacent first electrode pattern parts is in a range of 100 μm to 500 μm.

* * * * *